United States Patent
Yoshizawa

(10) Patent No.: US 6,311,049 B1
(45) Date of Patent: Oct. 30, 2001

(54) RECEIVING SIGNAL STRENGTH INDICATOR USES FEED FORWARD LEVEL DETECTING SIGNAL

(75) Inventor: Atsushi Yoshizawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/219,839

(22) Filed: Dec. 23, 1998

(30) Foreign Application Priority Data

Dec. 24, 1997 (JP) .................................................... 9-354937

(51) Int. Cl.$^7$ ........................................................ H04B 7/00
(52) U.S. Cl. .................................. 455/250.1; 455/226.2; 455/245.1; 342/380
(58) Field of Search ............................... 455/31.1, 31.2, 455/131, 138, 226.2, 234.1, 303, 307, 250.1, 245.1; 342/380, 375, 383

(56) References Cited

U.S. PATENT DOCUMENTS

| | | | |
|---|---|---|---|
| 4,186,351 | * 1/1980 | Brefini et al. ......................... | 455/186 |
| 4,665,560 | * 5/1987 | Lange ..................................... | 455/249 |
| 4,933,641 | 6/1990 | Hsiung et al. ........................ | 328/145 |
| 5,521,542 | 5/1996 | Kimura . | |
| 5,608,409 | * 3/1997 | Rilling .................................. | 342/380 |
| 5,754,560 | * 5/1998 | Nousiainen et al. .............. | 455/226.1 |
| 5,852,772 | * 12/1998 | Lampe et al. ...................... | 455/226.2 |
| 5,966,646 | * 10/1999 | Lampe et al. ...................... | 455/189.1 |

* cited by examiner

Primary Examiner—William Trost
Assistant Examiner—Tilahun Gesesse
(74) Attorney, Agent, or Firm—Jay H. Maioli

(57) ABSTRACT

An intermediate-frequency signal is fed to a demodulated-signal processing circuit through a variable gain circuit, an active filter, and a limiter. An RSSI output signal responsive to a received signal level is obtained through a low-pass filter by detecting the output of each stage of the limiter at a detector and by summing the output of the detector at an adder. The linearity of the RSSI output signal responsive to the received signal level is improved by feeding, via a coefficient multiplier to the adder, the control signal of a level detector which detects the control signal of the variable gain circuit, which limits the signal input to the active filter.

4 Claims, 6 Drawing Sheets

RECEIVING SIGNAL STRENGTH INDICATOR USES FEED FORWARD LEVEL DETECTING SIGNAL

BACKGROUND OF THE INVENTION

1. Field of the Invention

The present invention relates to a mobile radio receiver for receiving a signal in a desired frequency band and, more particularly, to a receiver having a circuit extracting accurately an RSSI signal indicative of the strength of a received radio wave.

2. Description of the Related Art

In portable transceivers as a terminal of mobile communications, such as an automobile radio apparatus and portable telephone, a high carrier frequency (in GHz) assigned to its radio system is modulated with a number of frequency-divided subcarriers, and each subcarrier frequency is then modulated with voice data, video data and control data at a channel within a particular frequency band out of tens of channels, each of which is divided in time slots to perform transmission and reception.

In such a mobile radio system, the input received signal level received at the terminal greatly varies depending on operational environments, and an assumption must be made that the received signal level varies in excess of 80 dB because of the distance between a terminal and a base station and level variations due to fading.

Also contemplated are adverse operational environments in which a signal level at an intended channel is low while a strong interfering wave is present at an adjacent channel.

In the transceiver system of such radio mobile system, a high-frequency circuit of superheterodyne reception system is employed. As a filter for extracting accurately a desired frequency, a filter employing a bulk device (such as surface acoustic wave (SAW) filter or piezoelectric device) is used to satisfy the requirements of a high sharpness and a wide dynamic range.

Since the transceiver system, as a portable terminal, must be as compact and light-weight in design as possible, the use of an active filter constructed of an IC circuit between intermediate frequency stages is contemplated.

FIG. 1 shows one example of a high-frequency receiving circuit of a terminal. A radio wave transmitted by a base station is received by an antenna 100. The received signal is amplified by a high-frequency amplifier 101 constructed of a low-noise device such as a GaAs FET device, and is mixed with a signal a local oscillator 103 supplies to a first mixer 102. The received signal is thus converted into a first intermediate frequency. A predetermined band is extracted from the first converted intermediate frequency by a SAW filter 104 or the like, is amplified by an intermediate frequency amplifier 105, and is fed to a second mixer 106.

The second mixer 106 is supplied with a signal from a second local oscillator 107 for selecting a desired channel frequency, and feeds a signal in a frequency band of a desired channel as a second intermediate frequency to a variable gain circuit 108.

A filter 109 (active filter) is provided to select the signal in the second intermediate frequency band.

The signal within the desired frequency band extracted by the active filter 109 is wave-shaped by a multistage limiter 111 to have a constant amplitude, and is then input to a demodulated-signal processing circuit 120 for data extraction.

The multistage limiter 111 has a gain of 20–30 dB per stage, and has a gain of 100 dB if it is a four-stage one, for example.

As a result, in normal reception conditions, the limiter 111 operates to output a signal in its substantially saturated state regardless of variations in the level of the received signal, and the output signal is clipped in a rectangular wave at a constant signal level and is fed to the demodulated-signal processing circuit 120.

In such a receiver, each gain stage 111(a, b, c, d) of the limiter 111 becomes saturated starting from a later one as a signal level rises. The output levels of the gain stages 111(b, b, c, d) of four are respectively detected by detectors 112(a, b, c, d). The output of these detectors are summed by an adder 113, and the summed signal is then smoothed by a low-pass filter 114 or the like. An RSSI (Receiving Signal Strength Indicator) output signal is thus obtained.

As in an invention already proposed by the inventors of this invention, the use of the active filter 109 as a filter to select a channel within a desired frequency band results in a narrow dynamic range compared with an ordinary solid filter element. For this reason, the variable gain circuit 108 is placed in front of the active filter 109 so that the output of a level detector 110 controls the variable gain circuit 108 to provide the gain control characteristics shown in FIG. 2A.

By controlling the input level to the filter to input a signal appropriately set in view of the dynamic range of the active filter 109, the filter is controlled not to be saturated over a wide received range and the extraction operation of an accurate channel frequency is thus permitted.

If the gain control is carried out to prevent the active filter 109 from saturating, the signal level fed to subsequent stages of the filter becomes different from that originally intended. In its normal operation, the limiter 111 must operate to saturate at any received signal levels, but if the signal level is controlled by the variable gain circuit 108 as shown in FIG. 2A, the signal level fed to the limiter 111 is limited at a signal level point P where the variable gain circuit 108 starts its control operation. The linearly increasing trend of the RSSI output indicative of the signal level is degraded as shown by a dotted line R in FIG. 2B, and the desired requirements of the receiving system, for example, the accurate switching of diversity and accurate detection operation of idle channels, are not satisfied.

SUMMARY OF THE INVENTION

To resolve the above problem, the mobile radio receiver of the present invention includes a variable gain circuit for frequency-converting at least a received signal, and for controlling the level of an intermediate frequency signal corresponding to said received signal, an active filter, to which the signal output by said variable gain circuit is input, for extracting said intermediate frequency signal, a multistage limiter for wave-shaping the output signal of said active filter, and a level detector for detecting the output level of said active filter to control the gain of said variable gain circuit, a plurality of detectors for detecting the signal level component at respective stages of said multistage limiter, a coefficient multiplier for multiplying the output signal of said level, detector by a predetermined coefficient, and an adder for summing the output signals of said plurality of detectors and the output of said coefficient multiplier.

Since the control signal of the variable gain circuit for limiting the input level to the active filter contains information about the received signal level, the signal level information, which is not detected in the detected output given by the limiter, is compensated for by multiplying the control signal by an appropriate coefficient, and the received signal level and the RSSI output signal are made linearly proportional as shown by line Q in FIG. 2B.

DESCRIPTION OF THE PREFERRED EMBODIMENTS

Figure 1:
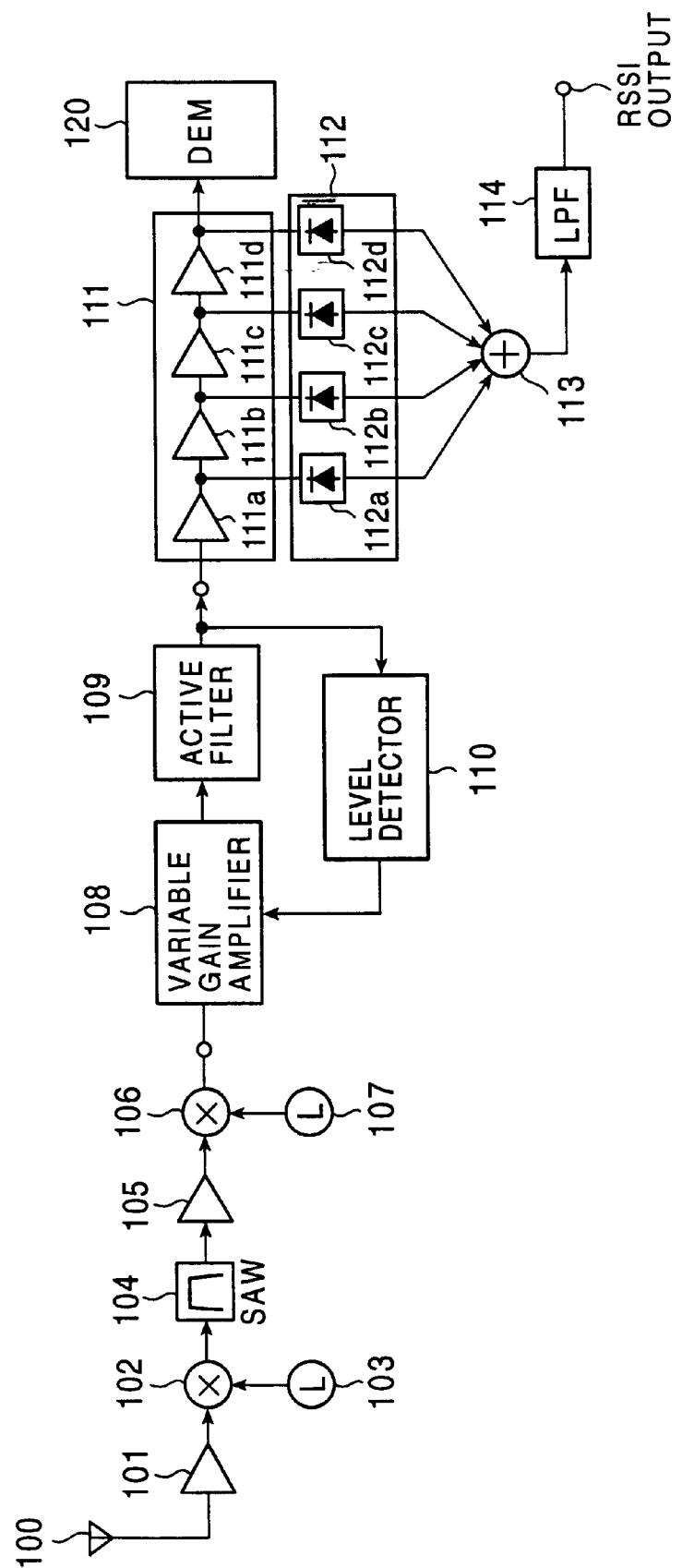
FIG. 1 is an explanatory diagram of a receiving circuit of a mobile radio receiver.
Figure 3:
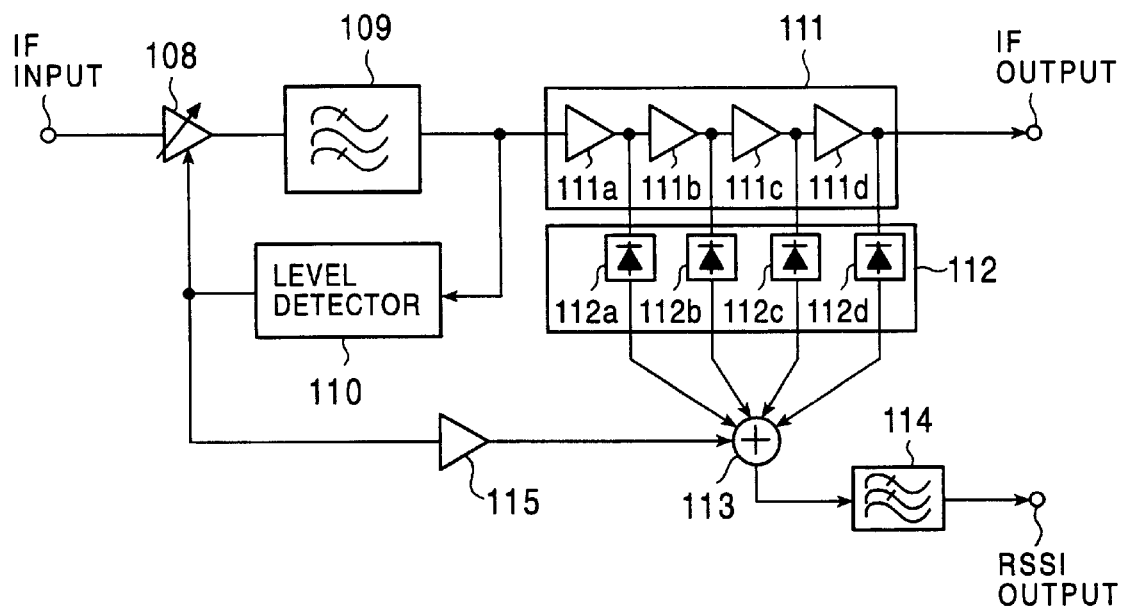
FIG. 3 is a block diagram showing a major portion of a mobile radio receiver of the present invention.

FIG. 3 is a major portion of a block diagram of a mobile radio receiver of the present invention, wherein the high-frequency signal circuit is omitted and components identical to those with reference to FIG. 1 are designated with the same reference numerals.

As shown, an active filter 109, constructed of an IC circuit, is typically designed to provide a transfer function having a high sharpness (Q) to assure a channel selectivity. When the receiver is a digital radio apparatus performing a digital modulation, a filter having cosine rolloff characteristics is used.

The active filter meeting these requirements has difficulty operating on a wide dynamic range covering all received signal levels of 80 dB or higher. If a compact and power-saving design is implemented in the terminal in portable applications, the dynamic range of the filter suffers a substantial limitation.

The level detector 110 for monitoring the level at the output terminal of the active filter 109 is provided, and the detected signal is used to control the gain of the variable gain circuit 108 that is an intermediate frequency amplifier. For example, the input signal to the active filter 109 is limited to a range below a certain level value as shown in FIG. 2A so that level control is carried out to prevent saturation from hindering the normal filtering operation of the active filter 109.

Figure 2A:
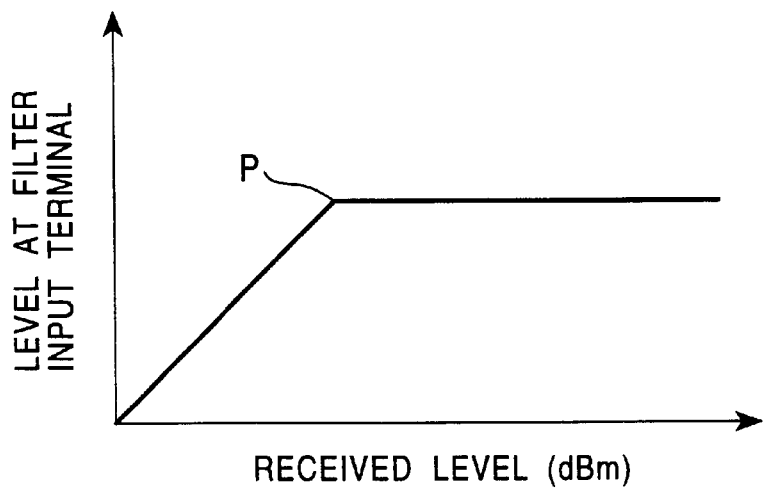
FIGS. 2A and 2B are explanatory diagrams showing the relationship between the output characteristics of the active filter and an RSSI output signal.

As a result, the signal level at the output of the active filter 109 is controlled as shown in FIG. 2A and the signal component output from active filter 109 remains constant in response to the input above the certain constant value, and a desired channel frequency is thus selected by the active filter 109.

On the other hand, the control signal output by the level detector 110 is fed to a coefficient multiplier 115, where an adequate coefficient is imparted thereto, and the adder 113 sums the resulting signal and the output signals provided by the detector 112 that detects the output of the limiter 111, thereby producing the RSSI output signal.

The signal level component that is limited prior to input to the active filter 109 is extracted by the coefficient multiplier 115 and is fed to the adder 113, thereby compensating for the received signal level to obtain an accurate RSSI output signal.

Figure 2B:
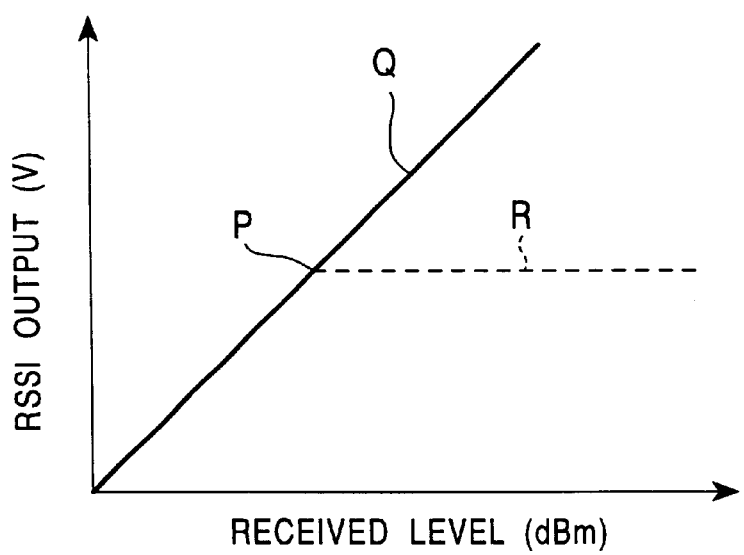

The coefficient multiplier 115 uses an adequate value as its coefficient to adjust the gradient of the compensated RSSI output signal Q at the level control starting point P and above as shown in FIG. 2B. Since it is typically required that the RSSI output signal be proportional to the dBm value that is the logarithm of a received power, the detector 112 is preferably designed to give a proportional value in a logarithmic scale as its output.

When the control signal of the level detector 110 is proportional to the received power, the coefficient multiplier 115 must give its output that is the logarithm of the input signal. Specifically, the coefficient multiplier 115 is preferably constructed of a logarithmic converter.

When the control signal is originally logarithmically proportional to the received power, the coefficient multiplier 115 may be fixed at a constant coefficient.

Figure 4:
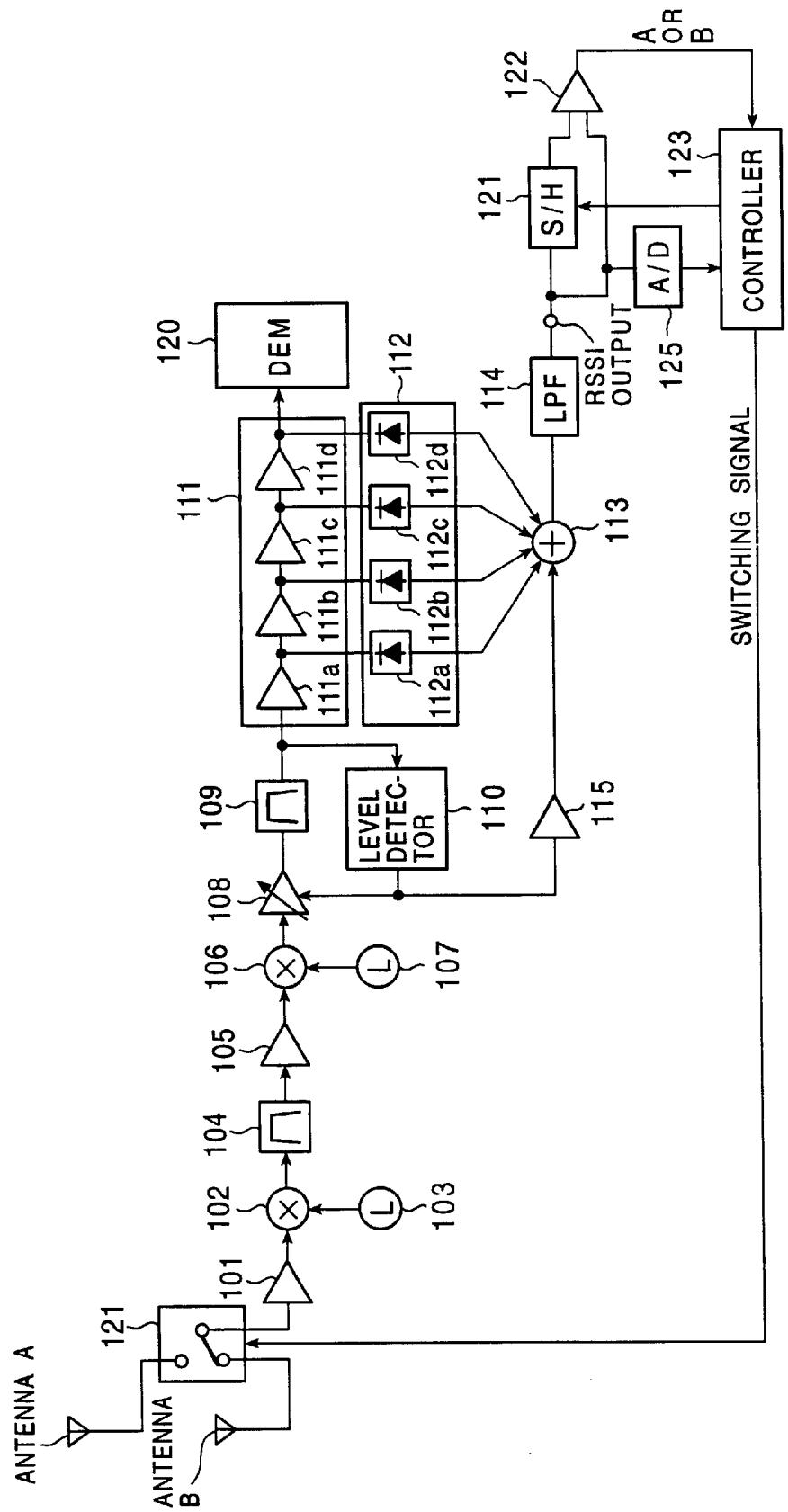
FIG. 4 is a block diagram showing another embodiment of the present invention.
Figure 5:
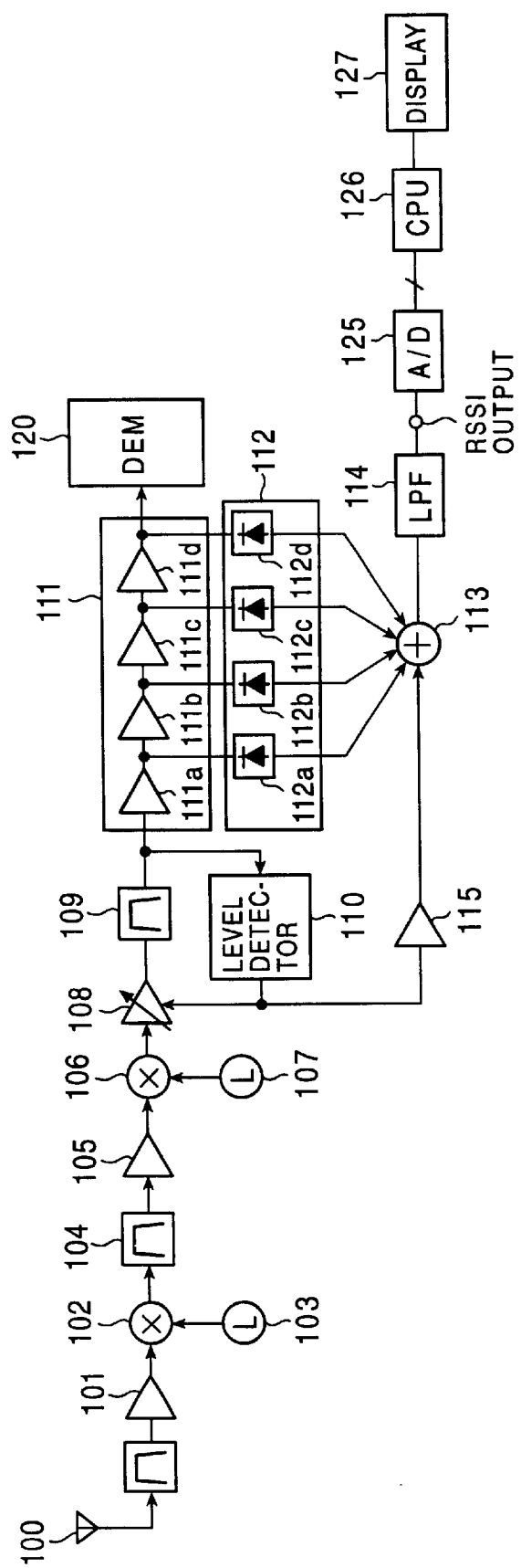
FIG. 5 is a block diagram showing yet another embodiment of the present invention.

Referring to FIG. 4 and FIG. 5, there are shown preferred embodiments of mobile radio apparatuses that are controlled by such an RSSI output signal.

The above-described RSSI output signal indicates the strength of the received power, and is thus used as a diversity antenna switching signal.

Referring to FIG. 4, the RSSI output signal, filtered and then output by the adder 113, is held at a sample-and-hold circuit 121 when one antenna is selected, and next, a comparator 122 compares the RSSI output signal with the one prior to or subsequent to the holding, from the other antenna selected.

The comparison output from the comparator 122 is input to a system controller 123 which determines which of the outputs is greater in an automatic antenna selection mode, and the system controller 123 outputs to a antenna changeover switch 124 a switching signal to switch to one of the antennas A and B, whichever gives a higher signal level.

The system controller 123 continuously monitors the level of the RSSI output signal through an A/D converter 125, and, before reception, switches back and forth between the antenna A and the antenna B to measure the received signal levels of the two antennas.

Depending on the measured results, the system controller 123 outputs the switching signal to the antenna changeover switch 124 to select the antenna giving a higher received signal level.

During reception, the system controller 123 holds the received signal level of the antenna currently in use in the sample-and-hold circuit 121 and switches to a monitor mode in which the levels of the held signal and the RSSI output signal currently being received are compared.

In the monitor mode, the system controller 123 automatically switches between the antennas when the output of the comparator 122 drops below a certain value for a predetermined duration.

Referring to FIG. 5, the RSSI output signal is used to display the strength of the received signal level.

In this embodiment, the RSSI output signal of the adder 113 is converted into a digital signal through the A/D converter 125, and is then fed to a microcomputer 126 of the receiver. The microcomputer 126 converts the value of the RSSI output signal into a received electric field intensity signal and presents it on a display 127.

Since the received electric field intensity is presented on the display 127, it is used as reference data to build a network for the mobile radio system.

Figure 6:
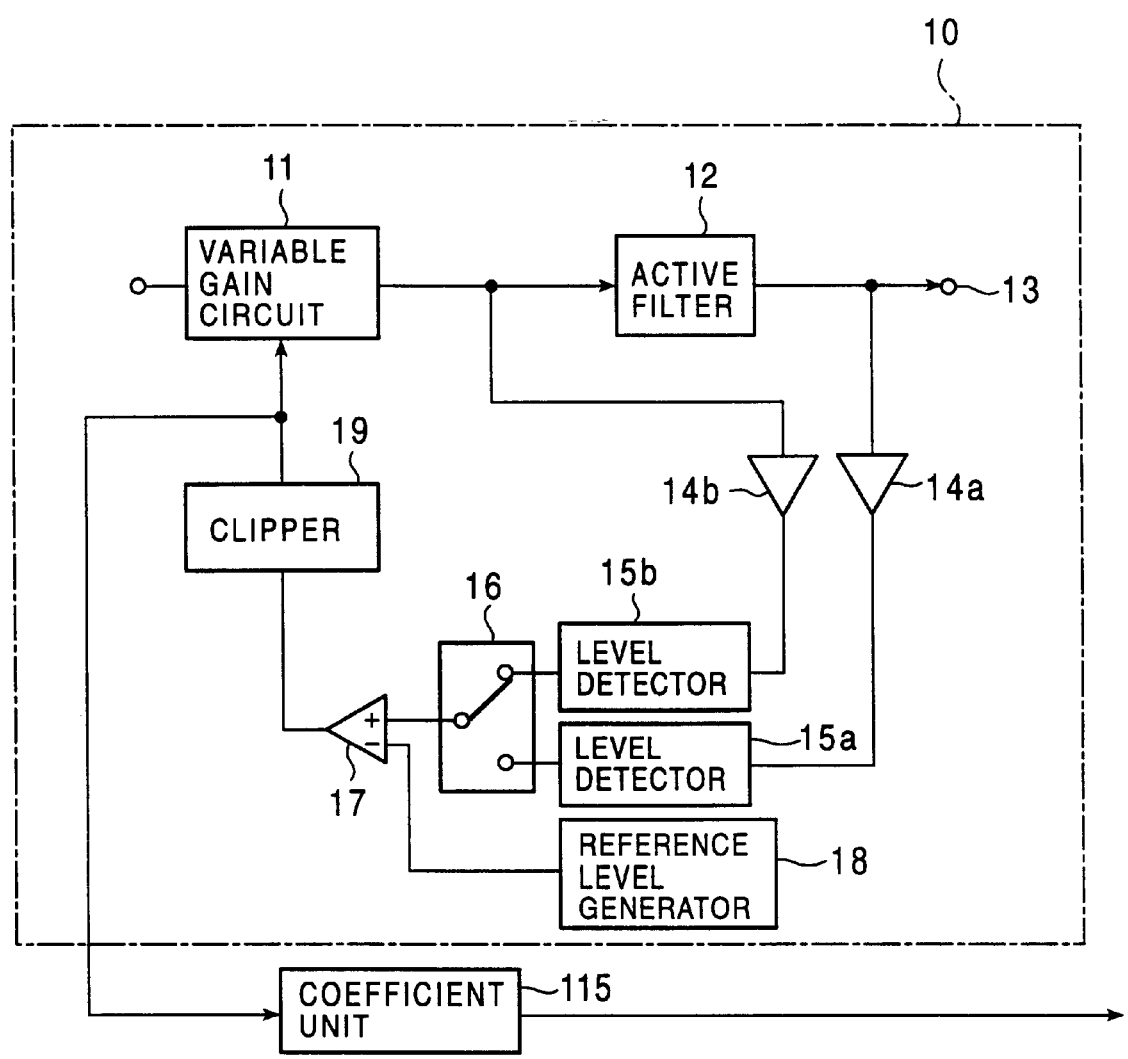
FIG. 6 is a schematic diagram showing an active filter having two gain control lines.

FIG. 6 shows an embodiment the inventors of this invention has already proposed in which an active filter is employed. In the active filter, designated 10, level detectors for controlling the input level to the filter employ two control signals. As described below, the signal level within a desired frequency band and a detected signal indicative of the signal level within a frequency band working as an interfering signal are input to a variable gain circuit 11, the output of which is input to an active filter 12.

The output signal of the active filter 12 is then fed to the above-described limiter 111 via the terminal 13, and is then fed to the demodulated-signal processing circuit 120.

The output signal of the active filter 12 is detected by a first coefficient circuit 14a and a first level detector 15a and the signal input to the active filter 12 is detected by a second coefficient circuit 14b and a second level detector 15b. A switching circuit 16 selects either the signal from the detector 15a or the signal from the detector 15b, whichever greater, a comparator 17 compares it with the voltage of a reference level generator 18, and the gain of the variable gain circuit 11 is controlled via a clipper 19.

The filter is gain-controlled initially at the level of input signals including an interfering signal, and gain control is then performed on the input signals based on the desired signal output by the filter. Even when a strong interfering signal is present adjacent to the desired signal, proper gain control is performed on the desired radio wave frequency. In a radio receiver equipped with this means, the RSSI output signal having a good linearity and corresponding to real received signal level is output by feeding the detected signal component output by the comparator 17 to the previously-described adder 113 via the coefficient multiplier 115.

In addition, the RSSI output signal may be used as a signal for detecting an idle channel in an MCA radio system, and the RSSI output signal may convey, to a user, information indicating whether a radio apparatus is present within a service coverage, and in any case, it is important that the RSSI output signal have linear characteristics against the received signal level.

In the present invention, the variable gain control signal is factored in the RSSI output signal even when the use of the active filter helps implement compact and lightweight design in the radio apparatus, and the received signal level and the RSSI output signal result in linear characteristics at a high accuracy as shown in FIGS. 2A and 2B, which help the radio apparatus to exhibit fully its receiving performance.

What is claimed is:

1. A mobile radio receiver, comprising:
   a variable gain circuit for controlling in response to a control signal a level of an intermediate frequency signal derived from a received signal to provide a variable gain output signal;
   an active filter, to which the variable gain output signal is input, for extracting said intermediate frequency signal to produce an active filter output signal;
   a multistage limiter for wave-shaping the active filter output signal;
   a level detector for detecting an output level of said active filter output signal and producing said control signal fed back to control a gain of said variable gain circuit, wherein when the output level of said active filter output signal exceeds a predetermined level said control signal is increased to maintain the output signal level of said variable gain circuit at a constant level;
   a plurality of detectors for detecting signal level components at respective stages of said multistage limiter and for producing a respective plurality of detector output signals;
   a coefficient multiplier receiving said control signal for multiplying said control signal by a predetermined coefficient to produce a coefficient multiplier output signal; and
   an adder for summing the plurality of detector output signals and the coefficient multiplier output signal being fed forward and producing a receiving signal strength indicator as a sum thereof.

2. A mobile radio receiver according to claim 1, wherein said coefficient multiplier multiplies the output signal of said level detector by a coefficient that transforms the output signal of said level detector into a logarithmic value.

3. A mobile radio receiver according to claim 1, further comprising at least two antennas, wherein one of said at least two antennas is selected according to the level of the output signal of said adder.

4. A mobile radio receiver according to claim 1, wherein a received electric field intensity is displayed in response to the level of said output signal of said adder.

* * * * *